(12) United States Patent
Wong et al.

(10) Patent No.: US 7,804,023 B2
(45) Date of Patent: Sep. 28, 2010

(54) BIFACIAL THIN FILM SOLAR CELL AND METHOD FOR MAKING THE SAME

(75) Inventors: Te-Chi Wong, Chiayi County (TW); Jian-Shu Wu, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 302 days.

(21) Appl. No.: 11/759,644

(22) Filed: Jun. 7, 2007

(65) Prior Publication Data

US 2008/0257399 A1 Oct. 23, 2008

(30) Foreign Application Priority Data

Apr. 19, 2007 (TW) .............................. 96113783 A

(51) Int. Cl.
*H01L 31/0224* (2006.01)
*H01L 31/0352* (2006.01)

(52) U.S. Cl. ....................... 136/256; 136/243; 136/252; 136/258; 438/57

(58) Field of Classification Search .......... 136/252–265

See application file for complete search history.

(56) References Cited

U.S. PATENT DOCUMENTS

| 5,071,490 | A | | 12/1991 | Yokota et al. | |
|---|---|---|---|---|---|
| 5,538,563 | A | * | 7/1996 | Finkl | 136/246 |
| 7,259,322 | B2 | * | 8/2007 | Gronet | 136/246 |
| 2001/0045229 | A1 | * | 11/2001 | Komori et al. | 136/251 |
| 2005/0056312 | A1 | * | 3/2005 | Young et al. | 136/258 |
| 2006/0086386 | A1 | * | 4/2006 | Nakano et al. | 136/255 |
| 2006/0191567 | A1 | * | 8/2006 | Mitsui | 136/256 |
| 2007/0157962 | A1 | * | 7/2007 | Gronet | 136/251 |
| 2008/0047602 | A1 | * | 2/2008 | Krasnov | 136/256 |

\* cited by examiner

*Primary Examiner*—Jennifer K Michener
*Assistant Examiner*—Jayne Mershon
(74) *Attorney, Agent, or Firm*—J.C. Patents

(57) ABSTRACT

A bifacial thin film solar cell and method for fabricating the same are provided. The solar cell has a first and a second transparent substrates, a first and a second solar cell modules, and an insulating layer. The first solar cell module is formed on the first transparent substrate, and has a metal layer as one of the electrodes of the first solar cell module and as a light reflection layer. The insulating layer is formed on the metal layer of the first solar cell module. The second solar cell module is formed between the insulating layer and the second transparent substrate.

13 Claims, 4 Drawing Sheets

US 7,804,023 B2

BIFACIAL THIN FILM SOLAR CELL AND METHOD FOR MAKING THE SAME

CROSS-REFERENCE TO RELATED APPLICATION

This application claims the priority benefit of Taiwan application serial no. 96113783, filed Apr. 19, 2007. All disclosure of the Taiwan application is incorporated herein by reference.

BACKGROUND OF THE INVENTION

1. Field of the Invention

The present invention generally relates to a solar cell, and more particularly, to a bifacial thin film solar cell and method for fabricating the same.

2. Description of Related Art

Through governmental policy and the need to reduce carbon dioxide production, the incorporation of solar cells into building structures has become a common trend. The solar cells can be installed on rooftops. However, in dense city areas, space is quite limited and open surface areas for installing the solar cells are small. Yet, the vertical glass curtain walls surrounding a building have a large surface area and can be utilized to install solar cells in the future. In particular, thin film solar cells are ideal for generating some electricity without compromising the beauty of an architectural design. Therefore, how to increase the electric power generating capacity of single solar cell module is an important issue.

SUMMARY OF THE INVENTION

Accordingly, the present invention is to provide a bifacial thin film solar cell, which comprises a first and a second transparent substrate, a first and a second solar cell modules, and an insulating layer. The first solar cell module is formed on the first transparent substrate, and comprises a metal layer, serving as one electrode of the first solar cell module and also as a light reflection layer. The insulating layer is formed on the metal layer of the first solar cell module. The second solar cell module is formed between the insulating layer and the second transparent substrate. In addition, the insulating layer can be replaced with a glue layer.

Through the aforementioned structure or a structure fabricated using the aforementioned method, light passing through the transparent plastic substrate or the glass substrate illuminates the solar cell units and initiates the light energy to electrical energy conversion procedure. Because the metal layer can reflect incident light (sunlight and indoor light), the utilization rate of sunlight and indoor light is increased so that the electrical power generating efficiency is also increased.

In order to make the aforementioned and other objects, features and advantages of the present invention comprehensible, preferred embodiments accompanied with Figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
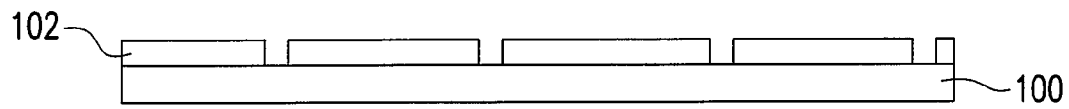
FIGS. 1A to 1H are schematic cross-sectional views showing a process for fabricating a bifacial thin film solar cell according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention mainly provides a bifacial thin film solar cell and a method for fabricating the same. The solar cell utilizes a reflective metal layer as one of the electrodes of the solar cell so that an incident light beam can be reflected to enhance the utilization rate of light and increase electrical power generating efficiency. In the following, a more detailed description of an embodiment of the present invention is provided.

FIGS. 1A to 1H are schematic cross-sectional views showing a process for fabricating a bifacial thin film solar cell according to an embodiment of the present invention. As shown in FIG. 1A, a transparent substrate 100 is provided. The transparent substrate 100 can be a plastic substrate or a glass substrate. A transparent conductive layer 102 is formed on the transparent substrate 100. The transparent conductive layer 102 can be a transparent conductive oxide (TCO) layer, for example. Thereafter, the transparent conductive layer 102 is patterned to form the electrodes of solar cell units. The material of the transparent conductive layer can be, for example, zinc oxide (ZnO), tin oxide ($SnO_2$) or any other suitable material. After forming the transparent conductive layer on the substrate 100, the transparent conductive layer can be patterned to form the patterned transparent conductive layer 102 by using a laser scriber or other methods.

Figure 1B:
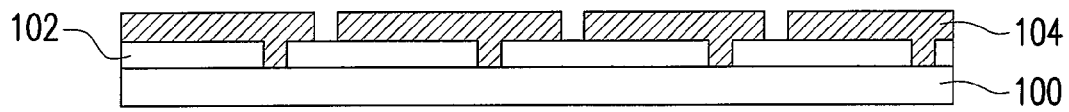

As shown in FIG. 1B, a plurality of solar cell units 104 is formed on the patterned transparent conductive layer 102. Each solar cell unit 104 comprises three thin films, namely, a P-type, an I-type (that is, intrinsic) and an N-type amorphous silicon film, for example. However, the solar cell unit 104 can also be a six-layered (2 sets of P, I and N-type) tandem structure of amorphous silicon and micro silicon or a three-layered tandem structure of amorphous silicon (1 set of P, I and N-type) and amorphous silicon-germanium (2 sets of P, I and N-type) or a six-layered (2 sets of P, I and N-type) tandem structure of amorphous silicon and micro silicon-germanium. Thereafter, the solar cell units 104 are patterned so as to isolate each solar cell unit 104 from its neighbors by using a laser scriber or other methods.

Figure 1C:
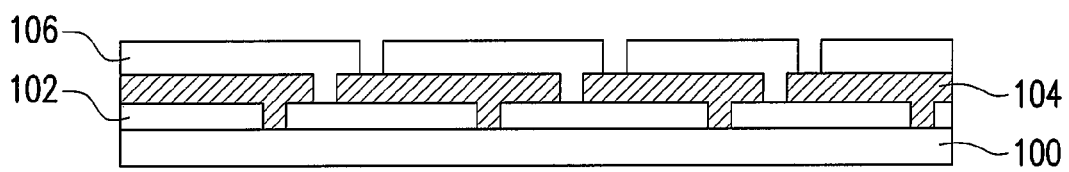

As shown in FIG. 1C, a metal layer 106 is formed on the solar cell units 104. Thereafter, the metal layer 106 is patterned so as to isolate each electrode from its neighbors by using a laser scriber. The metal layer 106 not only serves as the other electrode of each solar cell unit, but also serves as a reflector for reflecting light from a light source whose details will be subsequently described. To simplify the description, the transparent conductive layer 102, the solar cell unit 104 and the metal layer 106 are referred to as a first solar cell module under certain conditions in the following.

The metal layer 106 and the transparent conductive layer 102 serve respectively as the electrodes of each solar cell unit 104 after the patterning process so that each solar cell unit 104 can function to convert the light energy into the electrical energy. Furthermore, each of the electrodes formed after patterning the metal layer 106 and the transparent conductive layer 102 correspond to each of the solar cell units 104. Here, the method of correspondence can be arranged according to the design, for example, serial connection or parallel connection. For example, as shown in FIG. 1C, one solar cell unit 104 is formed between two adjacent electrodes of the transparent conductive layer. Moreover, the electrode of the metal layer corresponding to the solar cell unit 104 is formed above the solar cell unit 104 and electrically connected to the corresponding electrode (a transparent conductive layer 102) of an adjacent solar cell unit so as to form a serial arrangement.

Figure 1D:
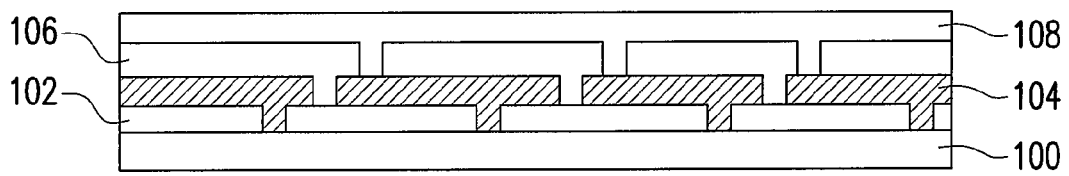

An insulating layer 108 is formed on the entire metal layer 106 as shown in FIG. 1D. The insulating layer 108 not only electrically isolates the electrodes of the metal layer 106 from one another, but also electrically isolates the first solar cell module from a subsequently formed second solar cell module. Since the insulating layer 108 can be fabricated by using any conventional technique such as a deposition process, no specific limitations are set here. The insulating layer can be a non-conductive oxide layer. However, there is no particular limitation on the type of materials as long as the material can provide function of electrical insulation.

Figure 1E:
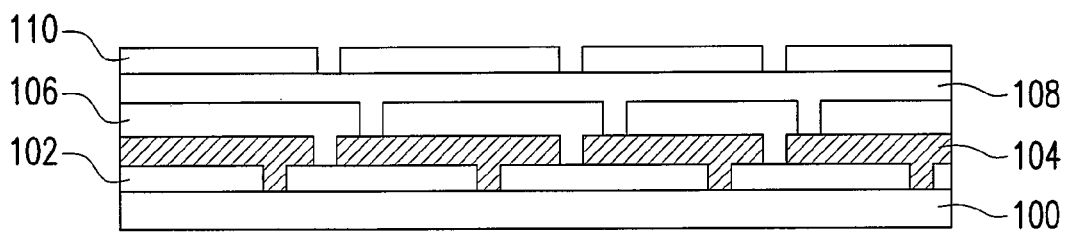

As shown in FIG. 1E, a conductive layer 110 is formed on the insulating layer 108. The conductive layer 110 is patterned to form a plurality of electrodes. The electrodes serve as the electrodes of solar cell units formed subsequently. Similarly, the conductive layer 110 can be a transparent conductive oxide material layer. In addition, the conductive layer 110 can also be a metal layer with light reflecting capability so that sunlight can be reflected again into the solar cell units.

Figure 1F:
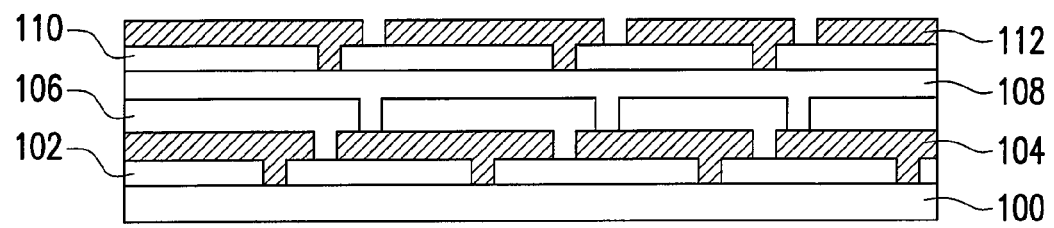

As show in FIG. 1F, a plurality of second solar cell units 112 is formed on the patterned conductive layer 110 (the electrodes). Similarly, the solar cell units 112 includes three thin films, namely, a P-type, an I-type (that is, intrinsic) and an N-type amorphous silicon film, for example. However, the solar cell units 112 can also be a six-layered (2 sets of P, I and N-type) tandem structure of amorphous silicon and micro silicon or a three-layered tandem structure of amorphous silicon (1 set of P, I and N-type) and amorphous silicon-germanium (2 sets of P, I and N-type) or a six-layered (2 sets of P, I and N-type) tandem structure of amorphous silicon and micro silicon-germanium. In the present embodiment, the first solar cell units 104 and the second solar cell units 112 are not limited to a particular solar cell type. In fact, any type of solar cell unit can be used.

Figure 1G:
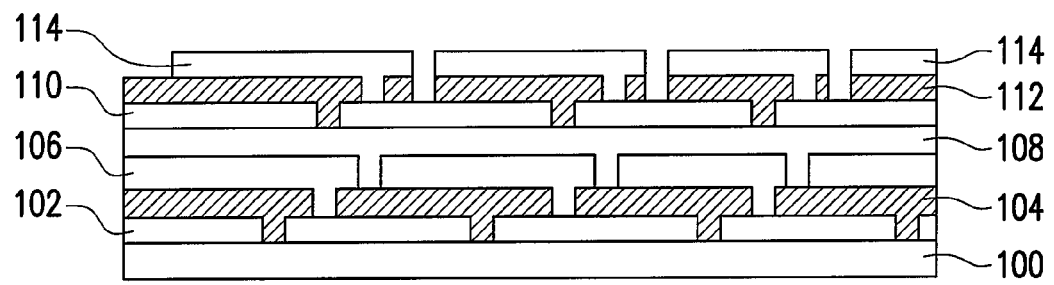

Thereafter, a transparent conductive layer 114 is formed on each solar cell unit 112 and patterned to form electrodes as shown in FIG. 1G. The completed structure shown in FIG. 1G refers to a bifacial cell unit.

Figure 1H:
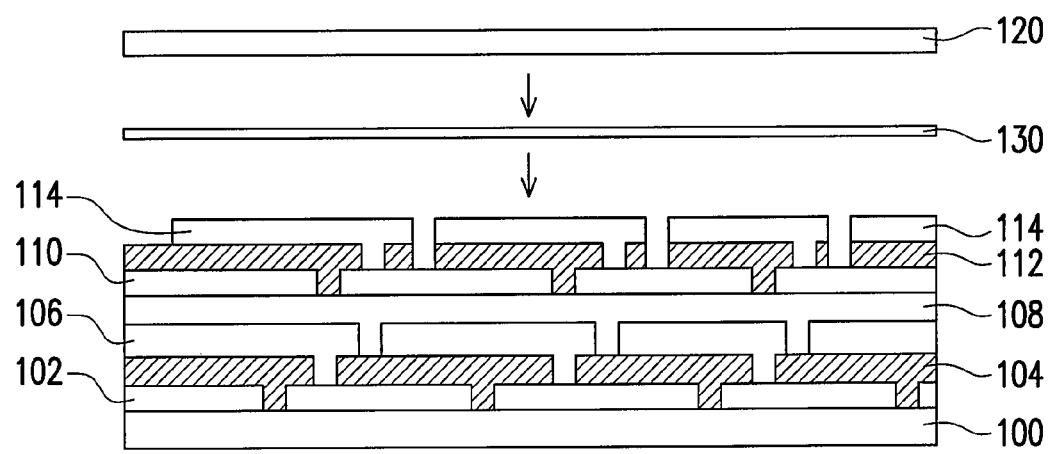

In FIG. 1H, the second transparent substrate 120 is glued to the transparent conductive layer 114 so as to complete the package of the bifacial thin film solar cell of the present embodiment. The second transparent substrate can be a transparent glass substrate. Moreover, the second transparent substrate 120 can be glued to the transparent conductive layer 114 to form a package by using a glue layer 130 made from ethyl vinyl acetate (EVA), for example. However, other suitable glue material can be used.

Figure 2:
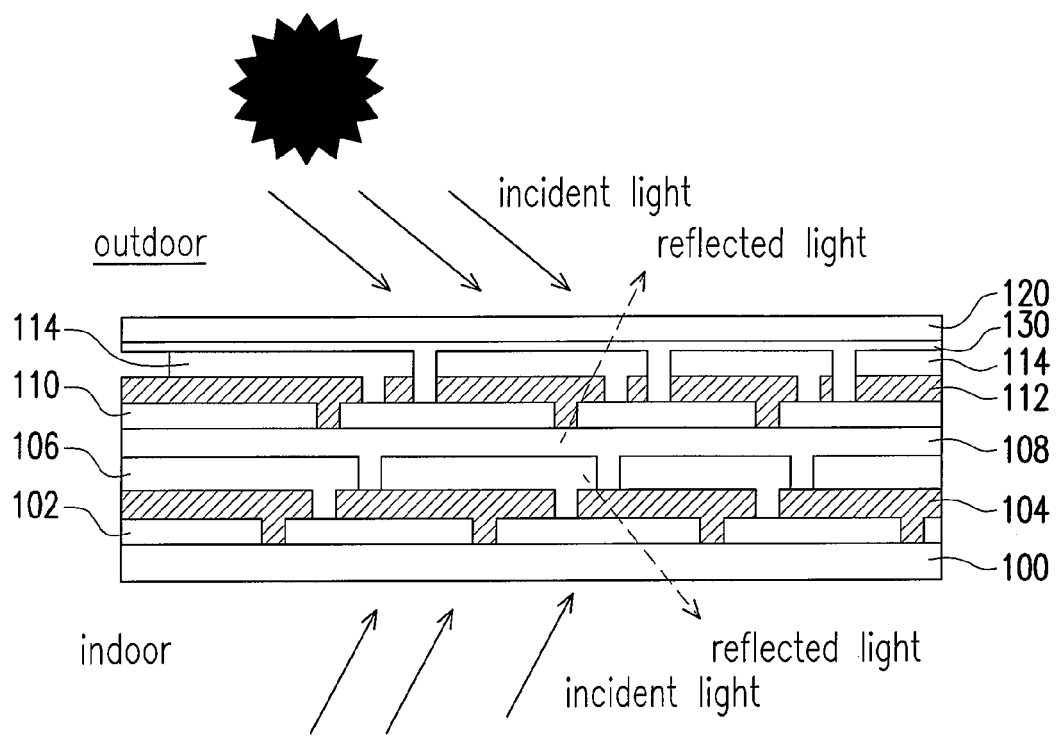
FIG. 2 shows an application of the bifacial thin film solar cell of the present invention.

FIG. 2 shows an application of the bifacial thin film solar cell of the present invention. As shown in FIG. 2, the bifacial thin film solar cell can be used as the vertical glass walls around a building, for example.

In the example shown in FIG. 2, the glass substrate 120 can be regarded as an exterior wall of the glass curtain wall and the plastic substrate or the glass substrate 100 can be regarded as an interior wall. In the outdoors, the sunlight passing through the glass substrate 120 irradiates the solar cell units 112, so as to carry out a procedure for converting the light energy into the electrical energy. Furthermore, the sunlight not absorbed by the solar cell units 112 is reflected by the metal layer 106 back to the solar cell units 112 so as to carry out a procedure for converting the light energy into the electrical energy.

Similarly, the solar cell at the indoor side functions in a similar way. Indoor light passing through the transparent plastic substrate or glass substrate 100 irradiates the solar cell units 104, so as to carry out a procedure for converting the light energy into the electrical energy. Furthermore, the indoor light not absorbed by the solar cell units 104 is reflected by the metal layer 106 back to the solar cell units 104, so as to perform a procedure for converting the light energy into the electrical energy. Therefore, the utilization rates of both sunlight and indoor light are increased so that the electrical power generating capacity is also increased.

On structure, the foregoing goal of reflecting sunlight or indoor light can be achieved with only one metal layer. However, the conductive layer 110 can also be a metal layer so as to increase the reflectivity.

As mentioned before, there is no particular limitations on the choices of solar cell units. However, a solar cell fabricated using amorphous silicon in general has better conversion efficiency for converting the light energy into the electrical energy at low light intensity. Therefore, at least for the solar cell units applied to a building as shown in FIG. 2, the solar cell units 104 can be solar cells fabricated using amorphous silicon while the solar cell units 112 can be solar cells fabricated using amorphous silicon and micro silicon.

In addition, a transparent plastic substrate can be used on one side and a glass substrate can be used on the other when the light weight of the substrate is also a consideration.

FIGS. 3A to 3H are schematic cross-sectional views showing a process for fabricating a bifacial thin film solar cell according to another embodiment of the present invention. In the foregoing embodiment, a continuous process of stacking one layer on top of another is used to produce the layers required to form the thin film solar cells. In the following embodiment, a solar cell module is fabricated on a transparent substrate and then two sets of solar cell modules are glued together to form a bifacial thin film solar cell.

Figure 3A:
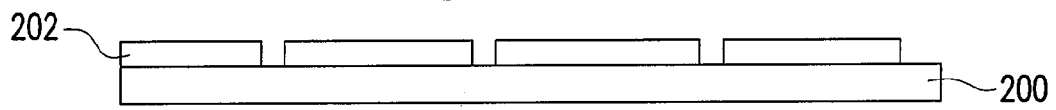
FIGS. 3A to 3H are schematic cross-sectional views showing a process for fabricating a bifacial thin film solar cell according to another embodiment of the present invention.

As shown in FIG. 3A, a transparent substrate 200 is provided. The transparent substrate 200 can be a plastic substrate or a glass substrate. A transparent conductive layer 202 is formed on the transparent substrate 200. Thereafter, the transparent conductive layer 202 is patterned to form the electrodes of the solar cell units. The material of the transparent conductive layer can be, for example, zinc oxide (ZnO), tin oxide ($SnO_2$) or any other suitable material. Similarly, the transparent conductive layer 202 can be patterned to form the patterned transparent conductive layer 102 by using a laser scriber.

Figure 3B:
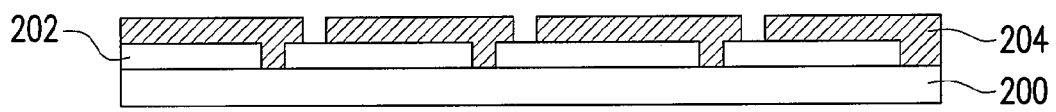
Figure 3C:
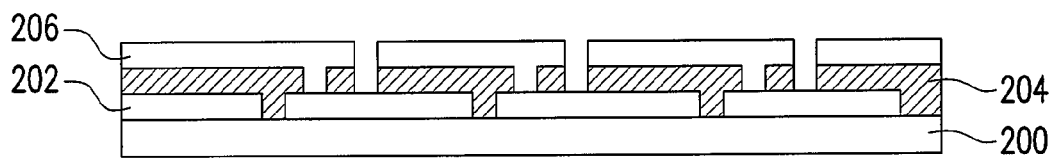

As shown in FIG. 3B, a plurality of solar cell units 204 is formed on the transparent conductive layer 202. Each solar cell units 204 comprises three thin films, namely, a P-type, an I-type and an N-type amorphous silicon film, for example. However, the solar cell units 104 can also be a six-layered (2 sets of P, I and N-type) tandem structure of amorphous silicon and micro silicon. As shown in FIG. 3C, a metal layer or a plated metal film 206 is formed on the solar cell units 204. The metal layer 206 is used as another electrode of the solar cell units 204 on one hand and is used as a reflective surface for reflecting light from a light source on the other hand.

Figure 3D:
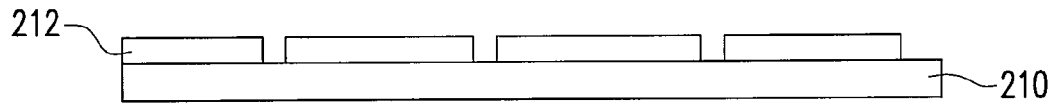
Figure 3E:
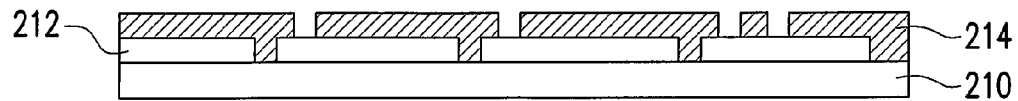
Figure 3F:
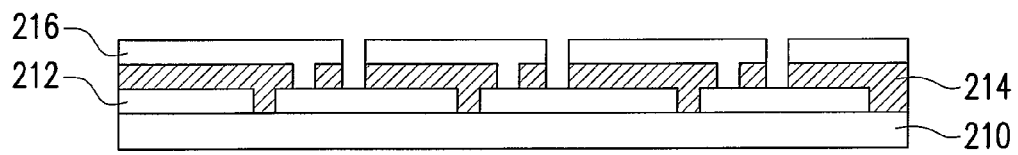

Similarly, as shown in FIGS. 3D to 3F, a transparent conductive layer 212, a plurality of solar cell units 214 and a conductive layer 216 are sequentially formed on a second transparent substrate 210. Since the structure of the transparent conductive layer 212 and the solar cell units 214 and the materials for forming them are identical to the ones in FIGS. 3A to 3C, their related descriptions are omitted. In addition, the conductive layer 216 in FIG. 3F can be a transparent conductive oxide layer. Alternatively, the conductive layer 216 can be a metal layer having a light reflecting capability so that the sunlight can be reflected back to the solar cell units 214 to increase the electrical power generating efficiency.

Figure 3G:
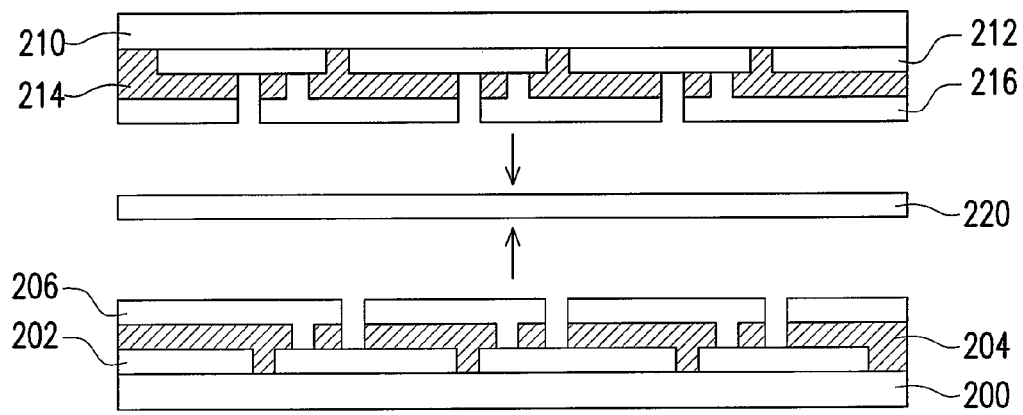
Figure 3H:
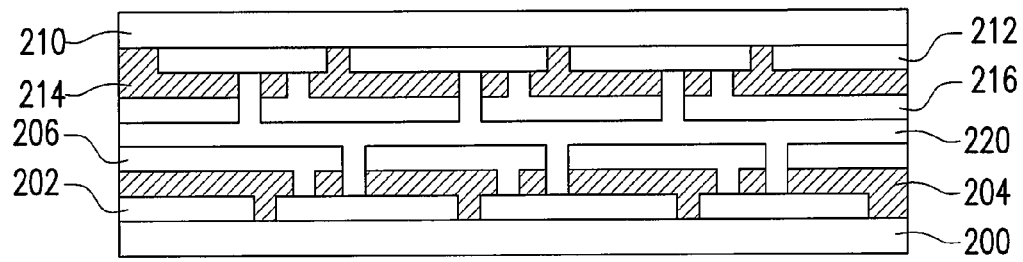

As shown in FIG. 3G, the two cell sets of solar cell modules shown in FIGS. 3C and 3F are glued together to form a complete bifacial thin film solar cell package as shown in FIG. 3H. In a similar way, gluing the solar cell modules to form a complete package can be achieved by using an ethyl vinyl acetate (EVA) layer 220.

In summary, the bifacial thin film solar cell of the present invention allows light to pass through the transparent plastic substrate or the glass substrate and irradiate the solar cell units so as to perform the procedure for converting the light energy into electrical energy. Moreover, the light not absorbed by the solar cell units is reflected back to the solar cell units by a metal layer, so as to perform the conversion from the light energy to electrical energy. Because the metal layer can reflect the sunlight and/or the indoor light, the utilization rates of the sunlight and the indoor light are increased, so that the electrical power generating efficiency is also increased.

Furthermore, the present invention can utilize the advantage of amorphous silicon to absorb most of the light energy in the visible light spectrum and convert it into electrical power by integrating an amorphous silicon type thin film solar cell with an amorphous silicon (a-Si)/micro silicon (μc-Si) type thin film solar cell to form a bifacial thin film solar cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bifacial thin film solar cell is capable of absorbing both indoor and outdoor light, comprising:
   a bifacial cell unit, comprising:
   a first transparent substrate;
   a first solar cell module, arranged on the first transparent substrate, wherein the first solar cell module further comprises a first metal layer serving as one of electrodes of the first solar cell module as well as a reflective layer for the first solar module and a second solar module;
   an insulating layer, arranged on the metal layer of the first solar cell module, and
   the second solar cell module, arranged between the insulating layer and a second transparent substrate; and
   a glue layer, for gluing the second transparent substrate with the second solar cell module of the bifacial cell unit.

2. The bifacial thin film solar cell according to claim 1, wherein the first transparent substrate is a transparent plastic substrate or a transparent glass substrate.

3. The bifacial thin film solar cell according to claim 1, wherein the second transparent substrate is a transparent glass substrate.

4. The bifacial thin film solar cell according to claim 1, wherein the first solar cell module further comprises:
   a first transparent conductive layer, patterned to form a plurality of electrodes;
   a plurality of first solar cell units, disposed to correspond with the respective electrodes; and
   the first metal layer, patterned to form a plurality of electrodes that corresponds with the respective first solar cell units.

5. The bifacial thin film solar cell according to claim 1, wherein the second solar cell module further comprises:
   a second transparent conductive layer, patterned to form a plurality of electrodes on the insulating layer;
   a plurality of second solar cell units, formed on the second transparent conductive layer and disposed to correspond with the respective electrodes of the second transparent conductive layer; and
   a third transparent conductive layer, patterned to form a plurality of electrodes on the second solar cell units and disposed to correspond with the respective second solar cell units.

6. The bifacial thin film solar cell according to claim 5, wherein the third transparent conductive layer and the second transparent substrate are glued by the glue layer.

7. The bifacial thin film solar cell according to claim 6, wherein the glue layer is an ethyl vinyl acetate (EVA) layer.

8. The bifacial thin film solar cell according to claim 1, wherein the second solar cell module further comprises:
   a second metal layer, patterned to form a plurality of electrodes on the insulating layer;
   a plurality of second solar cell units, formed on the second metal layer and disposed to correspond with the second metal layer and the electrodes; and
   a transparent conductive layer, patterned to form a plurality of electrodes on the second solar cell units and disposed to correspond with the respective second solar cell units.

9. The bifacial thin film solar cell according to claim 8, further comprising a glue layer for gluing the transparent conductive layer and the second transparent substrate.

10. The bifacial thin film solar cell according to claim 9, wherein the glue layer is an ethyl vinyl acetate (EVA) layer.

11. The bifacial thin film solar cell according to claim 4, wherein each first solar cell unit is formed using amorphous silicon, or is a tandem structure formed using amorphous silicon and micro silicon.

12. The bifacial thin film solar cell according to claim 5, wherein each second solar cell unit is formed using amorphous silicon, or is a tandem structure formed using amorphous silicon and micro silicon.

13. The bifacial thin film solar cell according to claim 6, wherein each second solar cell unit is formed using amorphous silicon, or is a tandem structure formed using amorphous silicon and micro silicon.

* * * * *